(12) United States Patent
Johnson et al.

(10) Patent No.: US 7,472,741 B2
(45) Date of Patent: Jan. 6, 2009

(54) FOIL SLOT IMPINGEMENT COOLER WITH EFFECTIVE LIGHT-TRAP CAVITIES

(75) Inventors: Scott T. Johnson, Torrance, CA (US); John H. Schroeder, Long Beach, CA (US); David Filgas, Newbury Park, CA (US)

(73) Assignee: Raytheon Company, Waltham, MA (US)

( * ) Notice: Subject to any disclaimer, the term of this patent is extended or adjusted under 35 U.S.C. 154(b) by 718 days.

(21) Appl. No.: 11/053,829

(22) Filed: Feb. 9, 2005

(65) Prior Publication Data

US 2006/0175041 A1   Aug. 10, 2006

(51) Int. Cl.
  *F28D 21/00* (2006.01)
  *H01S 3/04* (2006.01)
(52) U.S. Cl. .................. 165/80.2; 165/904; 165/908
(58) Field of Classification Search .......... 165/904, 165/908
  See application file for complete search history.

(56) References Cited

U.S. PATENT DOCUMENTS

| | | | |
|---|---|---|---|
| 4,392,362 A | 7/1983 | Little | |
| 4,494,171 A * | 1/1985 | Bland et al. | 361/704 |
| 4,540,453 A * | 9/1985 | Boredelon et al. | 148/310 |
| 4,552,439 A | 11/1985 | Hoag et al. | |
| 5,029,638 A | 7/1991 | Valenzuela et al. | |
| 5,105,430 A | 4/1992 | Mundinger et al. | |
| 5,145,001 A * | 9/1992 | Valenzuela | 165/164 |
| 5,835,345 A * | 11/1998 | Staskus et al. | 361/699 |
| 6,490,812 B1 | 12/2002 | Bennett et al. | |
| 6,690,696 B2 * | 2/2004 | Byren et al. | 372/35 |
| 6,763,050 B2 | 7/2004 | Zapata et al. | |
| 6,859,472 B2 * | 2/2005 | Betin et al. | 372/35 |
| 6,865,200 B2 * | 3/2005 | Takigawa et al. | 372/35 |
| 7,075,959 B1 * | 7/2006 | Downing et al. | 372/35 |
| 7,156,159 B2 * | 1/2007 | Lovette et al. | 165/104.33 |
| 2003/0231667 A1 | 12/2003 | Byren et al. | |
| 2004/0028094 A1 | 2/2004 | Betin et al. | |
| 2005/0252644 A1 * | 11/2005 | Hofmann | 165/109.1 |
| 2007/0017662 A1 * | 1/2007 | Valenzuela | 165/170 |

* cited by examiner

*Primary Examiner*—Allen J Flanigan
(74) *Attorney, Agent, or Firm*—Leonard A. Alkov

(57) ABSTRACT

A slot impingement cooler is formed of a plurality of sets of foils in a stacked and registered array. In each set of foils, a first foil has supply slots that direct a flow of coolant, a second foil has a plurality of effective light-trap cavities, a third foil has return slots that return the flow of coolant, and an optional fourth foil has a plurality of effective light-trap cavities. The foils have registered supply manifold openings and registered return manifold openings therethrough.

22 Claims, 4 Drawing Sheets

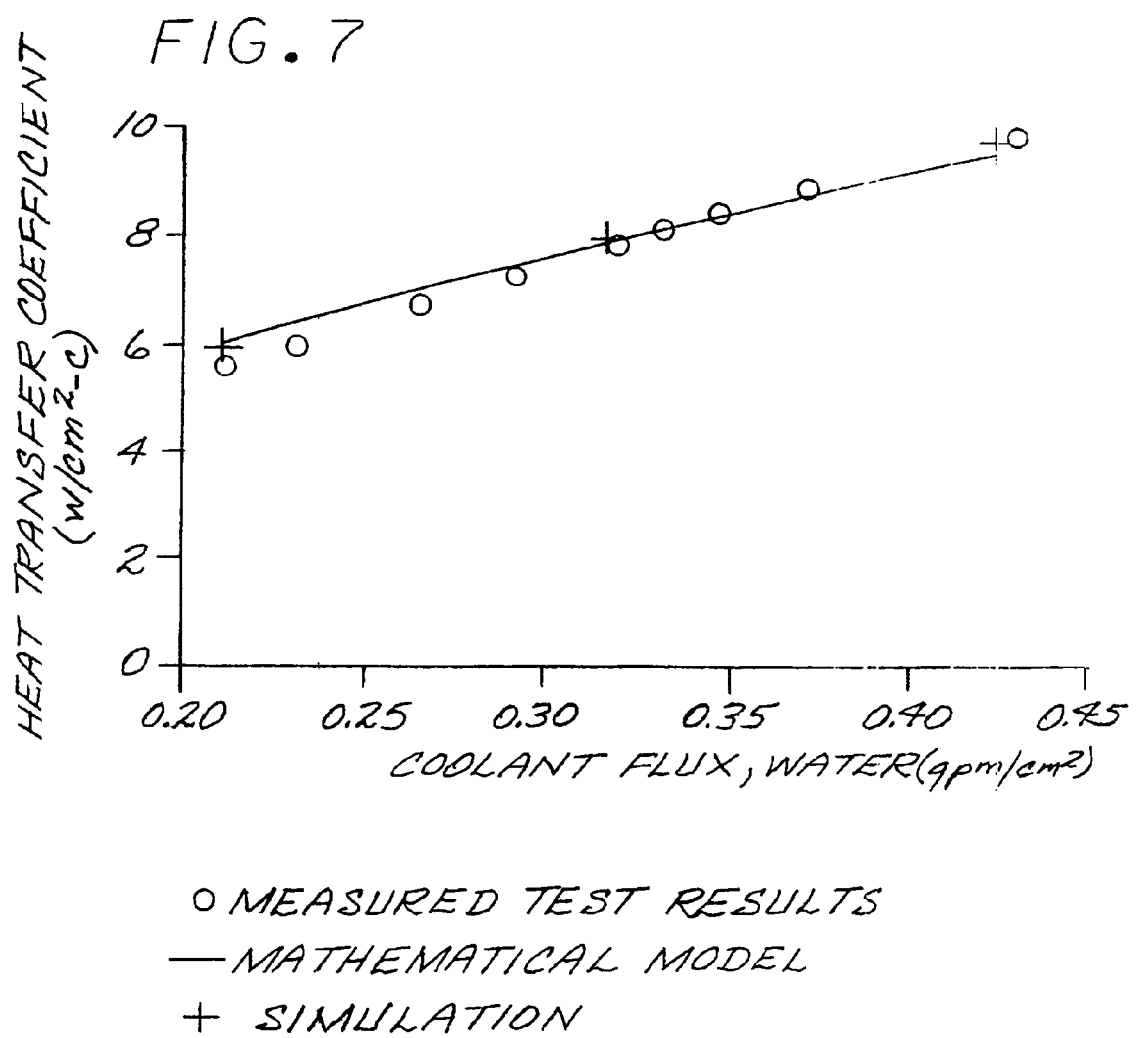

FOIL SLOT IMPINGEMENT COOLER WITH EFFECTIVE LIGHT-TRAP CAVITIES

This invention relates to an impingement cooler and more particularly, to a slot-jet impingement cooler having a foil construction and which includes effective light traps to trap, absorb, and dissipate light energy.

BACKGROUND OF THE INVENTION

Some solid-state devices produce a large waste-heat output in a small area during operation. The heat may be produced in two forms, sensible heat and light-energy heat. The heat must be removed rapidly when the solid-state device is in operation so that its maximum operating temperature is not exceeded. Additionally, the large amount of locally produced heat creates internal strains that cause the solid-state device to warp and possibly fail, if the heat is not removed. The heat may also cause damage to adjacent devices. An example of a solid-state device having these concerns is a solid-state laser whose laser amplifier chain laser gain media consists of a number of rectangular amplifier slabs that produce heat energy at their surfaces.

Several approaches have been used to removing the heat from such devices. In one, confined-flow heat exchangers are built into or located adjacent to the heat-producing surfaces of the solid-state device. While such confined-flow heat exchangers are operable, experience has shown that they cannot remove heat sufficiently rapidly for high-power devices that produce very large heat fluxes.

Jet impingement coolers have also been used. In this approach, one or more jets of a coolant, typically a liquid, are directed at the surface to be cooled. This approach is also operable but has shortcomings. The existing designs have a relatively small ratio of the jet area to the total area enclosed by the perimeter of the array of jets, despite efforts to increase this ratio. The result is that the ability to remove large amounts of heat is limited, unless the flow rate of coolant is so high as to be impractical for many situations. Additionally, there are periodic temperature gradients across the surface being cooled, resulting in undesirable transverse thermal strains in the solid-state device.

There is a need for an improved approach to cooling solid-state and other types of devices that produce a large amount of heat in a small volume and surface area. The present invention fulfills this need, and further provides related advantages.

SUMMARY OF THE INVENTION

The present invention provides a slot impingement cooler that produces a high flow of a coolant against a small area to cool a device that produces a large heat flux per unit of exposed area. The slot impingement cooler also provides for the trapping of light energy and dissipation of its associated heat flux.

In accordance with the invention, a slot impingement cooler comprises a foil set having a first set of foils in a stacked and registered array and arranged to provide cooling at a cooler surface. The first set of foils includes in order a first foil having a first-foil supply manifold opening through the first foil, a first-foil return manifold opening through the first foil, and a plurality of first-foil supply slots extending from the first-foil supply manifold opening to the cooler surface; a second foil having a second-foil supply manifold opening through the second foil, a second-foil return manifold opening through the second foil, and a plurality of second-foil effective light-trap cavities communicating with the cooler surface; and a third foil having a third-foil supply manifold opening through the third foil, a third-foil return manifold opening through the third foil, and a plurality of third-foil return slots extending from the third-foil return manifold opening to the cooler surface. Each foil preferably has a thickness of from about 0.005 to about 0.025 inches. The foils are preferably diffusion bonded together, but may be affixed together by other techniques or simply compressed together. The first-foil supply manifold opening, the second-foil supply manifold opening, and the third-foil supply manifold opening are in registry to define a supply manifold. The first-foil return manifold opening, the second-foil return manifold opening, and the third-foil return manifold opening are in registry to define a return manifold. There may be, and typically is, at least one additional set of foils, wherein the additional sets of foils have the same structure as the first set of foils. There is typically a cooled surface of an article being cooled disposed in facing relation to the cooler surface.

The first set of foils may optionally further include a fourth foil having a fourth-foil supply manifold opening through the fourth foil, a fourth-foil return manifold opening through the fourth foil, and a plurality of fourth-foil effective light-trap cavities communicating with the cooler surface. The fourth-foil supply manifold opening is in registry with the first-foil supply manifold opening, the second-foil supply manifold opening, and the third-foil supply manifold opening. The fourth-foil return manifold opening is in registry with the first-foil return manifold opening, the second-foil return manifold opening, and the third-foil return manifold opening. The fourth foil provides another set of effective light-trap cavities, in addition to those of the second foil. Other compatible features discussed herein may be used with this embodiment.

In a preferred form, a slot impingement cooler comprises a foil set comprising a plurality of sets of foils in a stacked and registered array and arranged to provide cooling at a cooler surface. Each set of foils includes in order the same foils as described above. Other compatible features discussed herein may be used with this embodiment as well.

More generally, a slot impingement cooler comprises a foil set having a plurality of sets of foils in a stacked and registered array and arranged to provide cooling at a cooler surface. The foil set includes a supply manifold extending through the foils, a return manifold extending through the foils, a plurality of supply slots extending from the supply manifold to the cooler surface, a plurality of return slots extending from the return manifold to the cooler surface, and a plurality of effective light-trap cavities communicating with the cooler surface. In one embodiment, as described above, the supply slots are disposed in a first foil of each set of foils, the effective light-trap cavities are disposed in a second foil (and optionally a fourth foil) of each set of foils, and the return slots are disposed in a third foil of each set of foils. Other compatible features discussed herein may be used with this embodiment.

In operation, a liquid or gaseous coolant is introduced under pressure from a source into the supply manifold. The coolant may be single phase throughout the process, or it may be a two-phase coolant wherein the coolant is first a gas and then condenses to a liquid as it exits the supply slots, and subsequently vaporizes as it absorbs heat. The coolant then flows through the supply slots to impinge upon the cooled surface and remove heat from the cooled surface. The coolant flows transversely along the cooled surface, and then away from the cooled surface through the return slots and thence into the return manifold. This flow of coolant against and across the cooled surface removes sensible heat from the cooled surface.

Additionally, the cooled surface radiates energy in the form of light (e.g., by fluorescence). The effective light-trap cavities of the slot impingement cooler trap that light and transform its energy into sensible heat, which is transferred to the flow of the coolant by conduction. The effective light-trap cavities of the present approach are present in addition to the supply slots and the return slots.

The slot impingement cooler directs a large flow of coolant against the cooled surface to remove a large amount of heat. It achieves a uniform impingement cooling over the cooled surface, avoiding large transverse temperature gradients. Both sensible heat and radiative heat are removed by the present approach. The slot impingement cooler may be readily scaled in size by adding more foil sets and/or making each foil set longer. The slot impingement cooler is also readily manufactured in quantity by foil etching of the individual foils, stacking the etched foils, and cutting the stacks.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 7 is a graph of surface heat extraction coefficient as a function of the coolant flux for a prototype slot impingement cooler.

DETAILED DESCRIPTION OF THE INVENTION

Figure 1:
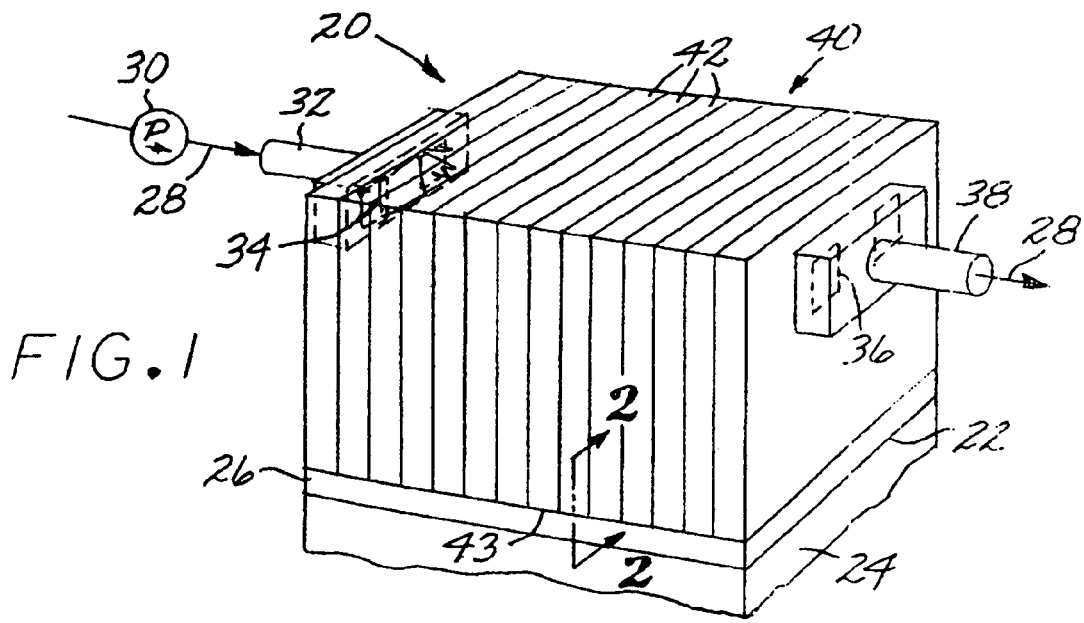
FIG. 1 is a perspective view of a preferred embodiment of a slot impingement cooler.

FIG. 1 depicts a slot impingement cooler 20 cooling a cooled surface 22 of a cooled article 24. The slot impingement cooler 20 is sealed to the cooled surface 22 by a seal ring 26 extending around the periphery of the slot impingement cooler 20. A flow of a coolant 28 pressurized by a pump 30 is supplied to the slot impingement cooler 20 by a supply line 32 feeding a supply manifold 34 within the slot impingement cooler 20. After cooling the cooled surface 22, the coolant 28 is removed through a return manifold 36 of the slot impingement cooler 20 that drains to a return line 38. The coolant 28 may be a liquid or a gas, and the cooling process may be single phase or dual-phase. The preferred coolant 28 is liquid water that remains in liquid form as it passes through the slot impingement cooler 20.

The slot impingement cooler 20 is formed of a foil set 40 that comprises at least one, and typically a plurality of, sets 42 of foils. The individual foils are thin sheets, preferably made of a thermally conductive material such as OFHC copper, or a copper-based material such as a copper alloy or dispersion-strengthened copper. Other materials such as stainless steel or a copper-molybdenum alloy may also be used. The sets 42 of foils are arranged in a stacked and registered array and disposed to provide cooling at a cooler surface 43 that is in a facing relationship to the cooled surface 22 of the cooled article 24. The arrangement of the sets 42 of foils is shown in end-on view in FIG. 2, and the structures of the individual foils are shown in FIGS. 3-6.

Figure 2:
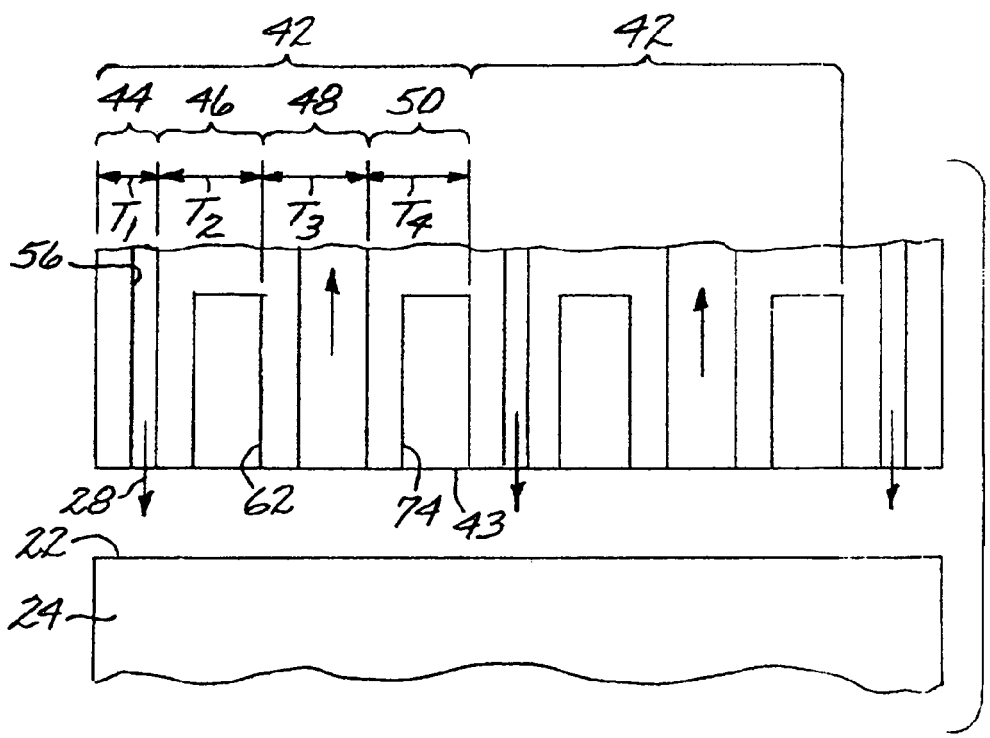
FIG. 2 is an enlarged schematic sectional view of a detail of FIG. 1 taken on line 2-2, illustrating foils making up the set of foils.
Figure 5:
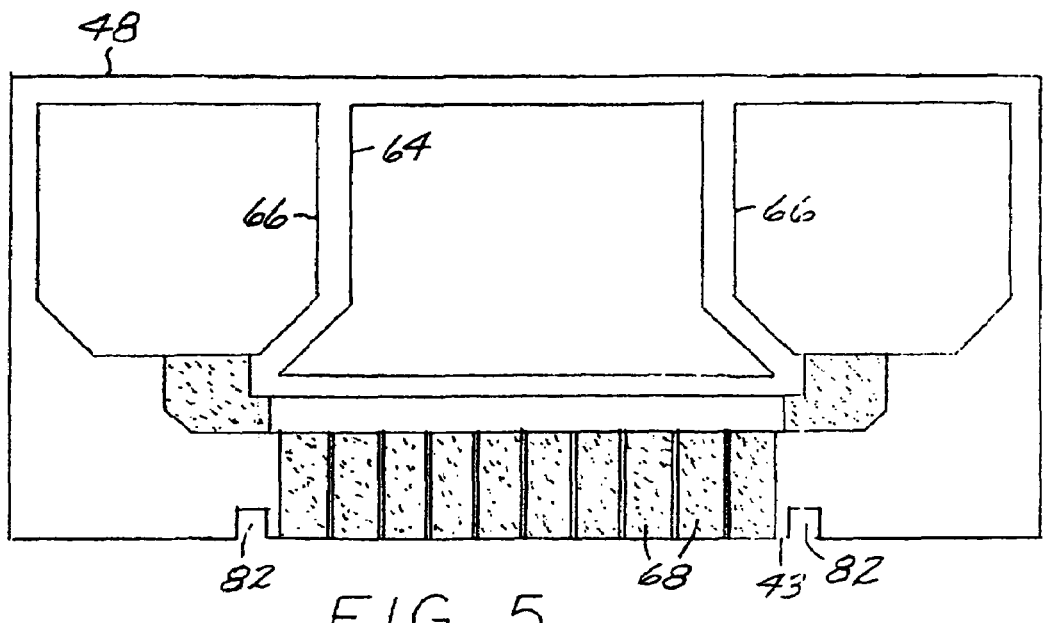
Figure 6:
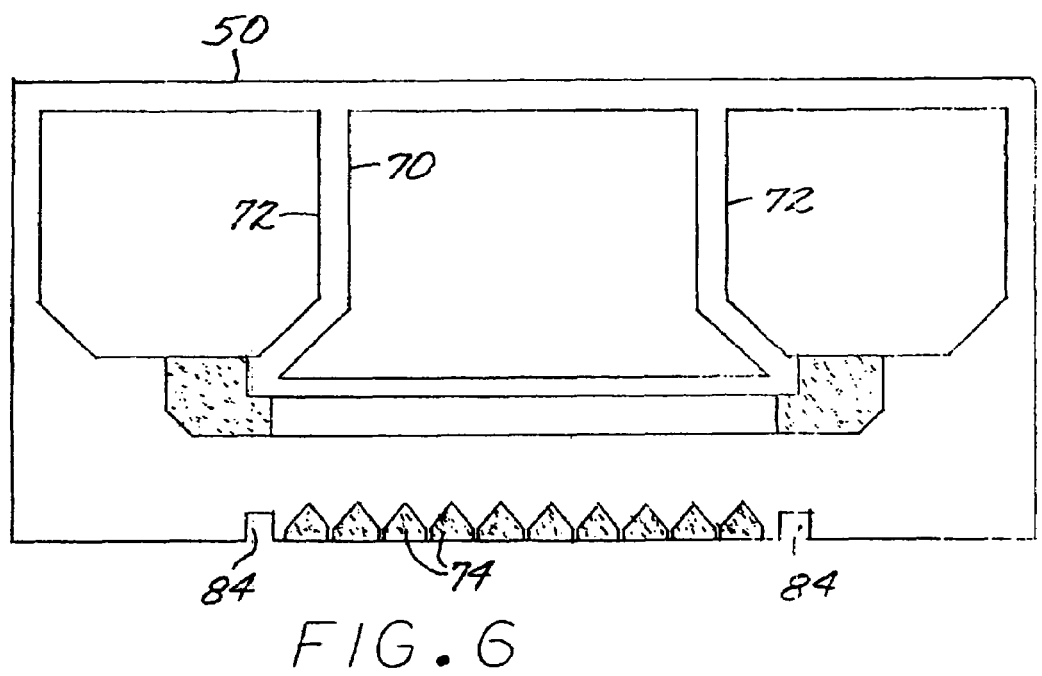

Referring to FIG. 2, each set 42 of foils preferably includes, in order, a first foil 44 (shown in plan view in FIG. 3), a second foil 46 (shown in plan view in FIG. 4), a third foil 48 (shown in plan view in FIG. 5), and a fourth foil 50 (shown in plan view in FIG. 6). The fourth foil 50 is optional and is preferably present, but it may be omitted. The fourth foil 50 provides space in the return manifold to collect the fluid coming in from the return slots, avoiding the need for an increased size of the cooler to avoid a flow imbalance.

The faces of the foils 44, 46, 48, and 50 are preferably joined together by diffusion bonding to form each set 42, and the faces of adjacent sets 42 of foils are also joined together by diffusion bonding. In the preferred practice, during assembly of the slot impingement cooler 20, all of the foils that make up the foil set 40 are stacked in a registered array and diffusion bonded together under pressure at an operable combination of temperature and time.

Figure 3:
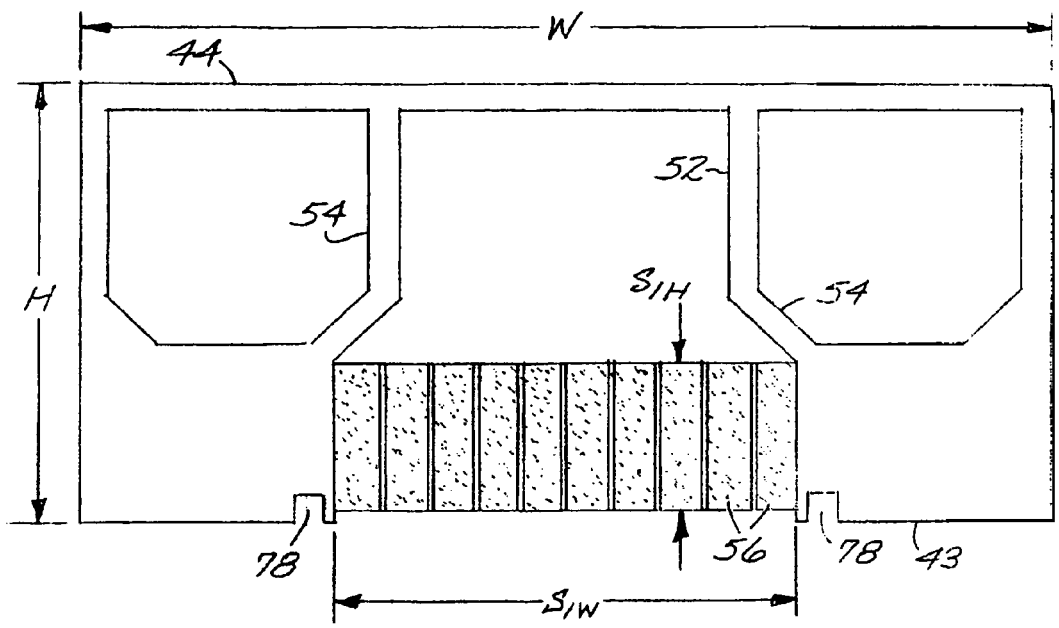
FIGS. 3-6 are plan views of the four foils that constitute each foil set.

The first foil 44 supplies coolant 28 from the supply manifold 34. Referring to FIG. 3, the first foil 44 has a first-foil supply manifold opening 52 through the first foil 44, two symmetrically positioned first-foil return manifold openings 54 through the first foil 44, and a plurality of first-foil supply slots 56 extending from the first-foil supply manifold opening 52 to and through the cooler surface 43. The first-foil supply manifold opening 52 is in fluid communication with and partially defines the supply manifold 34, and the first-foil return manifold openings 54 are in fluid communication with and partially define the return manifold 36. There is no communication through the first foil 44 between the first-foil supply slots 56 and the first-foil return manifold openings 54. The manifold openings 52 and 54 extend completely through the thickness of the first foil 44. The supply slots 56 extend part way through the thickness of the first foil 44, but not all of the way. Any operable dimensions may be used for a single-phase system, as the dimensions are not critical. Seal grooves 78 extending through the first foil 44 receive the seal ring 26. In the case of a prototype slot impingement cooler 20 built to test the present approach, the first foil 44 had a width W of about 1.5 inches, a height H of about 0.7 inches, and a thickness $T_1$ of about 0.0075 inches. The slot structure had a width $S_{1W}$ 0.63 inches, and a height $S_{1H}$ of about 0.25 inches. Each supply slot 56 had a depth of about 0.0025 inches (that is, extending about ⅓ of the way through the thickness of the first foil 44) and a width of about 0.054 inches. The manifold openings 52 and 54 had a height of about 0.36 inches and were separated from each other by about 0.050 inches. The manifold openings 52 and 54, and the supply slots 56 were formed by supplying the solid foil made of OFHC copper, and then etching the solid foil using appropriate masks.

Figure 4:
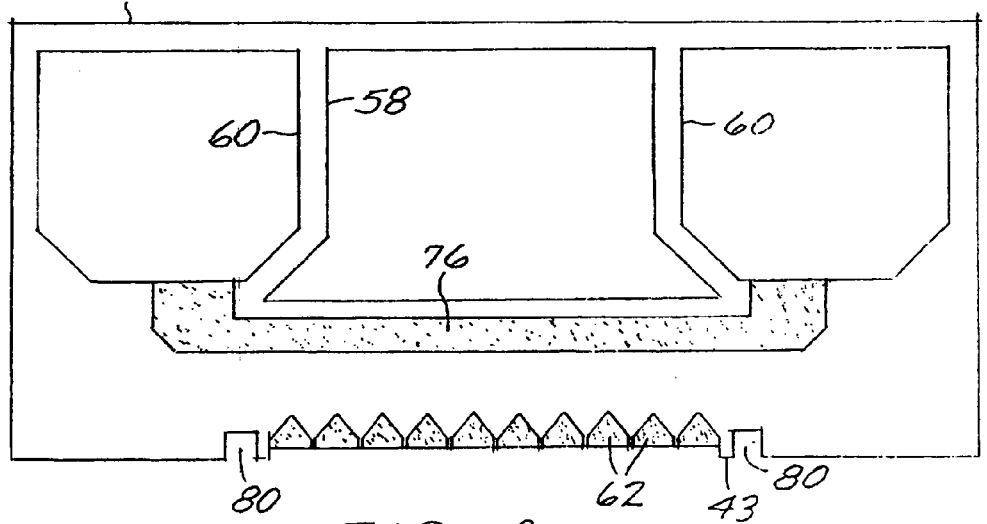

The second foil 46, illustrated in FIG. 4, traps light emitted from the cooled surface 22 of the cooled article 24, so that the energy in the trapped light may be converted to sensible heat in the second foil 46 and the third foil 48. The sensible heat is conducted to the coolant 28. The second foil 46 has a second-foil supply manifold opening 58 through the second foil 46, two symmetrically positioned second-foil return manifold openings 60 through the second foil 46, and a plurality of second-foil effective light-trap cavities 62 communicating with the cooler surface 43. The second-foil supply manifold opening 58 is in fluid communication with and partially defines the supply manifold 34, and the second-foil return manifold openings 60 are in fluid communication with and partially define the return manifold 36. There is no communication through the second foil 46 between the second-foil effective light-trap cavities 62 and either of the second-foil supply manifold opening 58 and the second foil return manifold opening 60. The manifold openings 58 and 60 extend completely through the thickness of the second foil 46. The effective light-trap cavities 62 extend part way through the thickness of the second foil 46, but not all of the way. Seal grooves 80, registered with the seal grooves 78 of the first foil 44 and extending through the second foil 46, receive the seal ring 26. Any operable dimensions may be used, as long as they are consistent with those of the other foils 44, 48, and 50. In the prototype, the overall width W and height H of the second foil 46, and the relative positions and dimensions of the manifold openings 58 and 60, are the same as for the corresponding elements of the first foil 44. The second foil effective light-trap cavities 62 were made the same width as the first foil supply slots 56 and were made 0.055 inches high. The manifold openings 58 and 60, and the second foil effective light-trap cavities 62 were formed by supplying the solid foil made of OFHC copper and then etching the solid foil using appropriate masks. A channel 76 connects the two second foil return manifold openings 60 to balance the flow distribution in the two second foil return manifold openings 60.

The third foil 48, shown in FIG. 5, provides a return path for coolant 28 introduced through the first foil supply slots 56. This coolant 28 in the return path is warmed by the transfer of heat from the cooled article 24. The third foil 48 has a third-foil supply manifold opening 64 through the third foil 48, a third-foil return manifold opening 66 through the third foil 48, and a plurality of third-foil return slots 68 extending from the third-foil return manifold opening 66 to the cooler surface 43. The third-foil supply manifold opening 64 is in fluid communication with and partially defines the supply manifold 34, and the third-foil return manifold openings 66 are in fluid communication with and partially define the return manifold 36. There is no communication through the third foil 48 between the third-foil return slots 68 and the third-foil supply manifold opening 64. Seal grooves 82, registered with the seal grooves 78 of the first foil 44 and the seal grooves 80 of the second foil 46 and extending through the third foil 48, receive the seal ring 26. Any operable dimensions may be used, as long as they are consistent with those of the other foils 44, 46, and 50. In the prototype, the overall width W and height H of the third foil 48, and the relative positions and dimensions of the manifold openings 64 and 66, are the same as for the corresponding elements of the first foil 44. In the prototype, for convenience the third-foil return slots 68 were made with the same dimensions as the first-foil supply slots 56, but that need not be the case. The manifold openings 64 and 66, and the third-foil return slots 68, were formed by supplying the solid foil made of OFHC copper, and then etching the solid foil using appropriate masks.

The optional fourth foil 50, shown in FIG. 6, which is preferably used and was included in the prototype, provides another set of effective light-trap cavities. The fourth foil 50 has a fourth-foil supply manifold opening 70 through the fourth foil 50, a fourth-foil return manifold opening 72 through the fourth foil 50, and a plurality of fourth-foil effective light-trap cavities 74 communicating with the cooler surface 43. The fourth-foil supply manifold opening 70 is in fluid communication with and partially defines the supply manifold 34, and the fourth-foil return manifold openings 72 are in fluid communication with and partially define the return manifold 36. The fourth foil 50, where used, has a structure comparable with that of the second foil 46. Seal grooves 84, registered with the seal grooves 78 of the first foil 44, the seal grooves 80 of the second foil 46, and the seal grooves 82 of the third foil 48, and extending through the fourth foil 50, receive the seal ring 26.

The second foil 46 and the fourth foil 50 separate the first foil 44 from the third foil 48. The separation is beneficial in that it aids in achieving a good flow distribution of the coolant 28 in the space between the cooler surface 43 and the cooled surface 22, and allows the space between the cooler surface 43 and the cooled surface 22 to be sufficiently large to be practical while still having a high rate of heat removal. In the prototype, the spacing between the cooler surface 43 and the cooled surface 22 was about 0.015 inches. A higher areal concentration of the supply slots 56 and the return slots 68 could be achieved if the foils 46 and 50 were not present, but the higher areal concentration would produce a lower flow per supply slot 56 or require a higher pressure in the supply manifold 34, would adversely affect the flow distribution of the coolant, and would require that the cooler surface 43 be closer to the cooled surface 22. The presence of the second foil 46 and the optional fourth foil 50 avoid these problems, and their effective light-trap cavities 62 and 74 have the important effect of trapping and converting the light energy produced by the cooled article 24 into sensible heat that is carried away by the coolant 28. Stated another way, intuition suggests that the more closely spaced are the coolant supply jets (i.e., the supply slots 56), the better would be the performance of the slot impingement cooler 20. However, this is not the case for the reasons discussed. For example, if the spacing between the cooler surface 43 and the cooled surface 22 were very small, such as about 0.005 inches or less, small variations in surface flatness or alignment of the surfaces 43, 22 could greatly interfere with the flow distribution of the coolant 28, leading to local boiling and hot spots that could in turn lead to the catastrophic failure of the cooled article 24. The present approach, on the other hand, achieves good removal of both sensible heat and light-energy in a practical structure.

The foils 44, 46, 48, and 50 are aligned and registered. That is, the first-foil supply manifold opening 52, the second-foil supply manifold opening 58, the third-foil supply manifold opening 64, and the fourth-foil supply manifold opening 70 (where the fourth foil 50 is used) are in registry to partially define the supply manifold 34. Similarly, the first-foil return manifold openings 54, the second-foil return manifold openings 60, the third-foil return manifold opening 66, and the fourth-foil return manifold openings 72 (where the fourth foil 50 is used) are in registry to partially define the return manifold 36.

The "effective light-trap cavities" 62, 74, as the term is used herein, are an array, preferably a regular array, of cavities that absorb the majority of the incoming radiant energy crossing the cavity opening due to reflections and re-reflections within the cavity. This mechanism is distinct from the use of a surface coating or a surface treatment to a flat surface to enhance light absorption, although the interiors of the effective light-trap cavities 62, 74 may optionally be provided with surface coatings or surface treatments to enhance light absorption.

In the present approach, light trapping is achieved by the coolant supply slots 56, the coolant return slots 68, and the wedge-shaped cavities 62, 74 disposed between the supply slots 56 and return slots 68. In the prototype cooler the wedge-shaped cavities 62, 74 have a depth-to-minimum opening ratio of about 5:1. This geometry combines with the copper oxide layer that naturally occurs on the OFHC copper to provide an effective overall surface emissivity of about 0.8 for the cooler light trap function. The present stacked-foil fabrication process is well suited for creating the light-trap cavity structure and the jet array in the same practical assembly.

The effective light-trap cavities 62, 74 of the present approach are present in addition to the supply slots 56 and the return slots 68. The supply slots 56 and the return slots 68 do achieve some light trapping but, by themselves, do not produce as high a combination of coolant performance and light-trapping efficiency as when the light-trap cavities 62, 74 are also present.

The use of commercially available coatings with the jet impingement cooler 20 to enhance light absorption was considered but rejected because such coatings could foul the cooler jet slots. Moreover, the commercially available coatings that were considered typically combined a thickness and thermal conductivity that would result in the coating being burned off or otherwise degraded in the presence of very high fluorescence heat fluxes greater than about 100 watts per square centimeter, for which the cooler 20 is designed. The inability of available coatings to tolerate long exposure to the variety of coolants, such as water, glycol-water mixtures, saturated ammonia, is an additional disadvantage to the use of surface coatings instead of a light-trap array, or to coat the interior of the light-trap array. However, if acceptable coatings or surface treatments were available, they could be used on the surfaces of the cooler 20 in addition to the effective light-trap cavities 62, 74 to enhance light absorption.

The embodiment of FIGS. 1-6 places the supply slots 56, the return slots 68, and the effective light-trap cavities 62 and 74 into different foils, which are formed from one side only for these elements of structure. In other embodiments, some of the supply slots 56, the return slots 68, and the effective light-trap cavities 62 and 74 could be formed into the same foil or foils. For example, the foil could be etched from the two opposite sides to place the supply slots 56 and some of the effective light-trap cavities 62, 74 into the same foil. This approach could have advantages in some situations, such as a reduction in the number of foils and an even closer spacing between the various rows of supply slots. However, such advantages must be weighed against disadvantages such as added manufacturing complexity in multiple etchings of the same foil. The selection of the approach depends upon the specific circumstances. However, the key consideration is that the supply slots 56, the return slots 68, and the effective light-trap cavities 62, 74 are placed into a foil structure.

The present approach has been reduced to practice in a prototype slot impingement cooler as discussed above. The prototype had 75 sets 42 of foils, and each set 42 of foils had the four foils 44, 46, 48, and 50 as described above. There were 10 supply slots 56 in each set 42 of foils. The spacing between the cooled surface 22 and the cooler surface 42 was about 0.015 inches. FIG. 7 presents measured test results (the data points) for the measured heat extraction coefficient as a function of the flux of water coolant, as well as the results of a mathematical model of the slot impingement cooler (the solid line) and a simulation (the plus signs). The prototype slot impingement cooler produced a uniform pattern of coolant spray across the entire cooled surface 22, as determined using a witness block.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A slot impingement cooler, comprising:
   a foil set comprising a first set of foils in a stacked and registered array and arranged to provide cooling at a cooler surface, wherein the first set of foils includes in order a first foil having
      a first-foil supply manifold opening through the first foil,
      a first-foil return manifold opening through the first foil, and
      a plurality of first-foil supply slots extending from the first-foil supply manifold opening to the cooler surface,
   a second foil having
      a second-foil supply manifold opening through the second foil,
      a second-foil return manifold opening through the second foil, and
      a plurality of second-foil effective light-trap cavities communicating with the cooler surface; and
   a third foil having
      a third-foil supply manifold opening through the third foil,
      a third-foil return manifold opening through the third foil, and
      a plurality of third-foil return slots extending from the third-foil return manifold opening to the cooler surface, wherein
   the first-foil supply manifold opening, the second-foil supply manifold opening, and the third-foil supply manifold opening are in registry to define a supply manifold, and wherein
   the first-foil return manifold opening, the second-foil return manifold opening, and the third-foil return manifold opening are in registry to define a return manifold.

2. The slot impingement cooler of claim 1, further including
   a second set of foils, wherein the second set of foils has the same structure as the first set of foils.

3. The slot impingement cooler of claim 1, wherein each foil has a thickness of from about 0.005 to about 0.025 inches.

4. The slot impingement cooler of claim 1, wherein the foils are diffusion bonded together.

5. The slot impingement cooler of claim 1, further including
   a cooled article having a cooled surface disposed in facing relation to the cooler surface.

6. The slot impingement cooler of claim 1, wherein the first set of foils further includes
   a fourth foil having
      a fourth-foil supply manifold opening through the fourth foil,
      a fourth-foil return manifold opening through the fourth foil, and
      a plurality of fourth-foil effective light-trap cavities communicating with the cooler surface, wherein
   the fourth-foil supply manifold opening is in registry with the first-foil supply manifold opening, the second-foil supply manifold opening, and the third-foil supply manifold opening, and wherein
   the fourth-foil return manifold opening is in registry with the first-foil return manifold opening, the second-foil return manifold opening, and the third-foil return manifold opening.

7. The slot impingement cooler of claim 6, further including
   a second set of foils, wherein the second set of foils has the same slot impingement cooler structure as the first set of foils.

8. The slot impingement cooler of claim 6, wherein each foil has a thickness of from about 0.005 to about 0.025 inches.

9. The slot impingement cooler of claim 6, wherein the foils are diffusion bonded together.

10. The slot impingement cooler of claim 6, further including
a cooled surface disposed in facing relation to the cooler surface.

11. A slot impingement cooler comprising:
a foil set comprising a plurality of sets of foils in a stacked and registered array and arranged to provide cooling at a cooler surface, wherein each set of foils includes in order
a first foil having
a first-foil supply manifold opening through the first foil,
a first-foil return manifold opening through the first foil, and
a plurality of first-foil supply slots extending from the first-foil supply manifold opening to the cooler surface,
a second foil having
a second-foil supply manifold opening through the second foil,
a second-foil return manifold opening through the second foil, and
a plurality of second-foil effective light-trap cavities communicating with the cooler surface;
a third foil having
a third-foil supply manifold opening through the third foil,
a third-foil return manifold opening through the third foil, and
a plurality of third-foil return slots extending from the third-foil return manifold opening to the cooler surface, and
a fourth foil having
a fourth-foil supply manifold opening through the fourth foil,
a fourth-foil return manifold opening through the fourth foil, and
a plurality of fourth-foil effective light-trap cavities communicating with the cooler surface, wherein
the first-foil supply manifold opening, the second-foil supply manifold opening, the third-foil supply manifold opening, and the fourth-foil supply manifold opening are in registry to define a supply manifold, and wherein the first-foil return manifold opening, the second-foil return manifold opening, the third-foil return manifold opening, and the fourth-foil return manifold opening are in registry to define a return manifold.

12. The slot impingement cooler of claim 11, wherein each foil has a thickness of from about 0.005 to about 0.025 inches.

13. The slot impingement cooler of claim 11, wherein the foils are diffusion bonded together.

14. The slot impingement cooler of claim 11, further including
a cooled article having a cooled surface disposed in facing relation to the cooler surface.

15. A slot impingement cooler, comprising:
a foil set comprising a set of foils in a stacked and registered array and arranged to provide cooling at a cooler surface, wherein the set of foils includes
a supply manifold extending through the foils,
a return manifold extending through the foils,
a plurality of supply slots extending from the supply manifold to the cooler surface,
a plurality of return slots extending from the return manifold to the cooler surface, and
a plurality of effective light-trap cavities communicating with the cooler surface, wherein the effective light-trap cavities are present in addition to the supply slots and the return slots.

16. The slot impingement cooler of claim 15, wherein the supply slots are disposed in a first foil of each set of foils, the effective light-trap cavities are disposed in a second foil of each set of foils, and the return slots are disposed in a third foil of each set of foils.

17. The slot impingement cooler of claim 15, wherein each foil has a thickness of from about 0.005 to about 0.025 inches.

18. The slot impingement cooler of claim 15, wherein the foils are diffusion bonded together.

19. The slot impingement cooler of claim 15, further including
a cooled surface disposed in facing relation to the cooler surface.

20. The slot impingement cooler of claim 15, wherein the supply slots, the return slats, and the effective light-trap cavities are present in different foils.

21. The slot impingement cooler of claim 15, wherein some of the supply slots, the return slots, and the effective light-trap cavities are present in the same foil.

22. The slot impingement cooler of claim 15, wherein the foils having supply slots therein have two opposite sides, and wherein the supply slots are present in one of the two opposite sides.

* * * * *